United States Patent
Cellek et al.

(10) Patent No.: US 9,312,299 B2
(45) Date of Patent: Apr. 12, 2016

(54) IMAGE SENSOR WITH DIELECTRIC CHARGE TRAPPING DEVICE

(71) Applicant: OMNIVISION TECHNOLOGIES, INC., Santa Clara, CA (US)

(72) Inventors: Oray Orkun Cellek, Mountain View, CA (US); Dajiang Yang, San Jose, CA (US); Sing-Chung Hu, San Jose, CA (US); Philip John Cizdziel, San Jose, CA (US); Dyson Tai, San Jose, CA (US); Gang Chen, San Jose, CA (US); Cunyu Yang, Milpitas, CA (US); Zhiqiang Lin, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/250,192

(22) Filed: Apr. 10, 2014

(65) Prior Publication Data
US 2015/0295007 A1 Oct. 15, 2015

(51) Int. Cl.
*H01L 27/146* (2006.01)
*H01L 31/167* (2006.01)

(52) U.S. Cl.
CPC ...... *H01L 27/14645* (2013.01); *H01L 27/1461* (2013.01); *H01L 27/1464* (2013.01); *H01L 27/14612* (2013.01); *H01L 27/14625* (2013.01); *H01L 27/14643* (2013.01); *H01L 27/14649* (2013.01); *H01L 27/14658* (2013.01); *H01L 31/167* (2013.01)

(58) Field of Classification Search
CPC ................... H01L 27/14654; H01L 27/14672
See application file for complete search history.

(56) References Cited

U.S. PATENT DOCUMENTS

| | | | |
|---|---|---|---|
| 3,660,819 A | | 5/1972 | Frohman-Bentchkowsky |
| 6,501,109 B1 * | | 12/2002 | Chi ................................ 257/223 |
| 7,667,250 B2 * | | 2/2010 | Mouli ........................... 257/292 |
| 2009/0153708 A1 | | 6/2009 | Hirota et al. |
| 2013/0050562 A1 * | | 2/2013 | Nakata .......................... 348/336 |

OTHER PUBLICATIONS

*See* Wikipedia, *EPROM*, http://en.wikipedia.org/wiki/EPROM (describing EPROM Operation, Details, Application, Sizes and Types) (as of Aug. 21, 2013 10:39 GMT).

* cited by examiner

*Primary Examiner* — Jerome Jackson, Jr.
*Assistant Examiner* — Steven B Gauthier
(74) *Attorney, Agent, or Firm* — Blakely Sokoloff Taylor & Zafman LLP

(57) ABSTRACT

An image sensor pixel includes a photosensitive element, a floating diffusion region, a transfer gate, a dielectric charge trapping region, and a first metal contact. The photosensitive element is disposed in a semiconductor layer to receive electromagnetic radiation along a vertical axis. The floating diffusion region is disposed in the semiconductor layer, while the transfer gate is disposed on the semiconductor layer to control a flow of charge produced in the photosensitive element to the floating diffusion region. The dielectric charge trapping device is disposed on the semiconductor layer to receive electromagnetic radiation along the vertical axis and to trap charges in response thereto. The dielectric charge trapping device is further configured to induce charge in the photosensitive element in response to the trapped charges. The first metal contact is coupled to the dielectric charge trapping device to provide a first bias voltage to the dielectric charge trapping device.

21 Claims, 10 Drawing Sheets

IMAGE SENSOR WITH DIELECTRIC CHARGE TRAPPING DEVICE

TECHNICAL FIELD

This disclosure relates generally to image sensors, and in particular but not exclusively, relates to CMOS image sensors.

BACKGROUND INFORMATION

Image sensors are widely used in digital still cameras, cellular phones, security cameras, as well as in, medical, automobile, and other applications. Complementary metal-oxide-semiconductor ("CMOS") technology is used to manufacture lower cost image sensors on silicon substrates. In a large number of image sensors, the image sensor commonly includes several light sensor cells or pixels. A typical individual pixel includes a micro-lens, a filter, a photosensitive element, a floating diffusion region, and one or more transistors for reading out a signal from the photosensitive element. The photosensitive element, floating diffusion region, and gate oxide are disposed on a substrate.

During operation, a CMOS image sensor is exposed to light which is converted into an electrical signal that is read out as a image. However, in conventional CMOS image sensors the electrical signature of an acquired image may often remain embedded in portions of the image sensor, which then appear in subsequently read out electrical signals of subsequently acquired images. The electrical signature of a previously sensed image remaining in the image sensor is often referred to as "ghosting," "a ghost artifact," or a "memory effect." Typically, this memory effect is unwanted and image sensor designers spend considerable effort in trying to eliminate or at least mitigate its presence.

BRIEF DESCRIPTION OF THE DRAWINGS

Exemplary embodiments are described with reference to the following figures, wherein like reference numerals refer to like parts throughout the various views unless otherwise specified.

DETAILED DESCRIPTION

Figure 1:
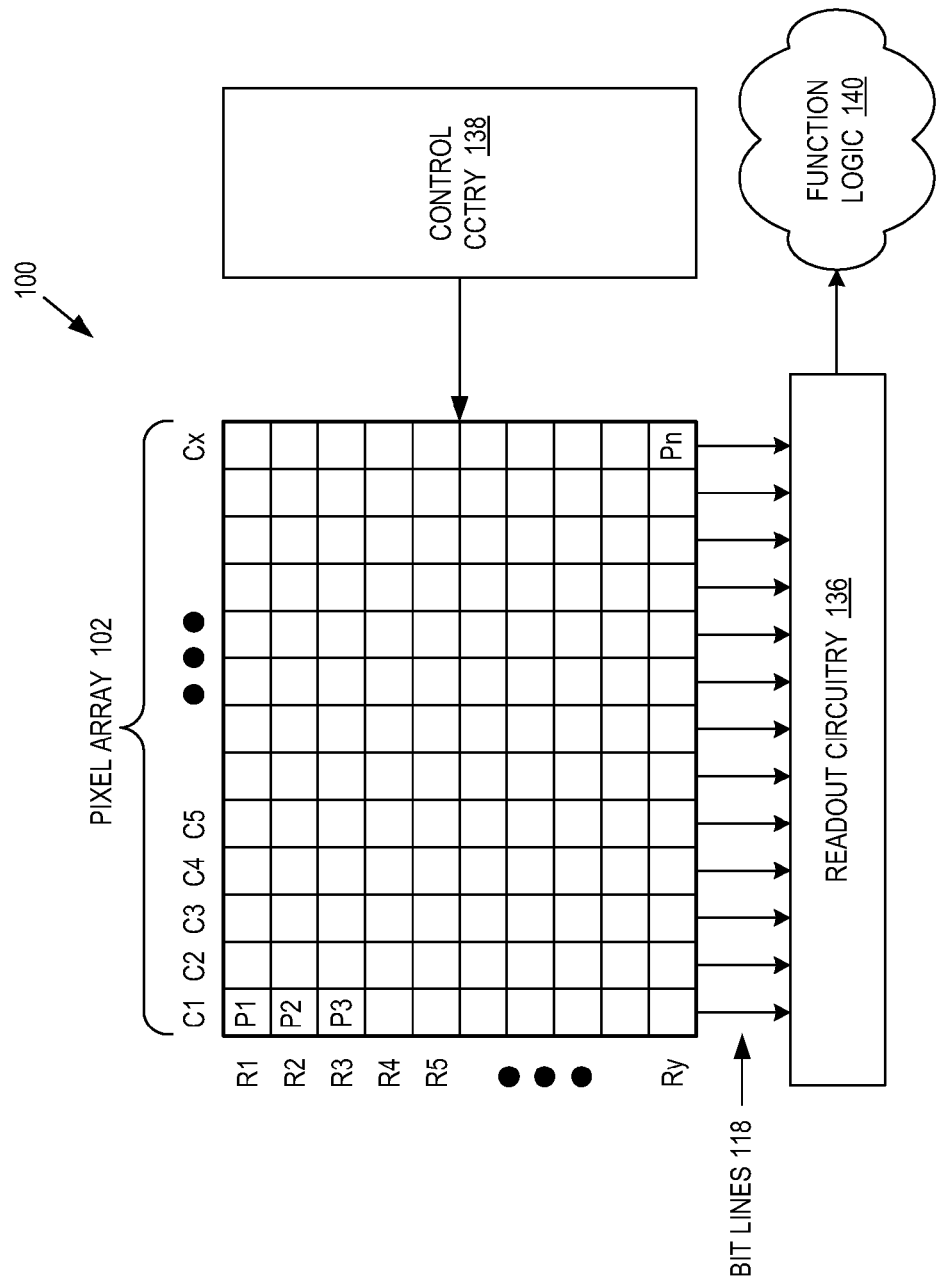
FIG. 1 is a block diagram illustrating an imaging system, in accordance with an embodiment of the present disclosure.

Embodiments of a pixel, an image sensor, an imaging system, and methods of fabrication of a pixel, image sensor, and imaging system having a dielectric charge trapping device are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects. For example, although not illustrated, it should be appreciated that image sensor pixels may include a number of conventional layers (e.g., antireflective films, etc.) used for fabricating CIS pixels. Furthermore, the illustrated cross sections of image sensor pixels illustrated herein do not necessarily illustrate all the pixel circuitry associated with each pixel. However, it should be appreciated that each pixel may include pixel circuitry coupled to its collection region for performing a variety of functions, such as commencing image acquisition, resetting accumulated image charge, transferring out acquired image data, or otherwise.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As mentioned above, the presence of ghosting or of the memory effect is unwanted in conventional CMOS image sensors. Often the memory effect is the result of the optical charging of one or more dielectric layers included in the image sensor. Embodiments of the present disclosure, intentionally utilize optically assisted charging of a dielectric layer in order to provide an improved image sensor. In one example, a dielectric charge trapping device is included in the CMOS image sensor and is configured to detect x-rays by utilizing charge trapping and readout rather than the photoconduction and readout used in conventional sensors. In another example, a dielectric charge trapping device is included in the CMOS image sensor to detect and image infrared radiation.

Various configurations of the above where the CMOS image sensors are front-side illuminated or back-side illuminated and where the dielectric charge trapping devices are located on the front-side or the back-side of the sensor are described in detail below. Furthermore, embodiments of the present disclosure may include a light source included in the image sensor, either on the front-side or the back-side, to emit an optical erase signal on the dielectric charge trapping device to erase any trapped charge.

FIG. 1 is a block diagram illustrating an imaging system 100, in accordance with an embodiment of the present disclosure. The illustrated embodiment of imaging system 100 includes pixel array 102 having one or more of the aforementioned improved characteristics, readout circuitry 136, function logic 140, and control circuitry 138. Pixel array 102 is a two-dimensional ("2D") array of image sensor pixels (e.g., pixels P1, P2 . . . , Pn). In one embodiment, each pixel is implemented using one or more of the below described pixels 200, 300, 500, 600, 700, and 800 of FIGS. 2-8. In one embodiment, each pixel is a complementary metal oxide semiconductor (CMOS) image sensor (CIS) pixel. In one embodiment, pixel array 102 includes a color filter array including a color pattern (e.g., Bayer pattern or mosaic) of red, green, and blue filters. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 136 and transferred to function logic 140. Readout circuitry 136 may include amplification circuitry, analog-to-digital ("ADC") conversion circuitry, or otherwise. Function logic 140 may simply store the image data or even manipulate the image data by applying post image effects (e.g., crop, rotate, remove red eye, adjust brightness, adjust contrast, or otherwise). In one embodiment, readout circuitry 136 may readout a row of image data at a time along readout column lines (illustrated) or may readout the image data using a variety of other techniques (not illustrated), such as a column/row readout, a serial readout, or a full parallel readout of all pixels simultaneously. Control circuitry 138 is connected with pixel array 102 to control operational characteristic of pixel array 102. For example, control circuitry 138 may generate a shutter signal for controlling image acquisition.

Figure 2:
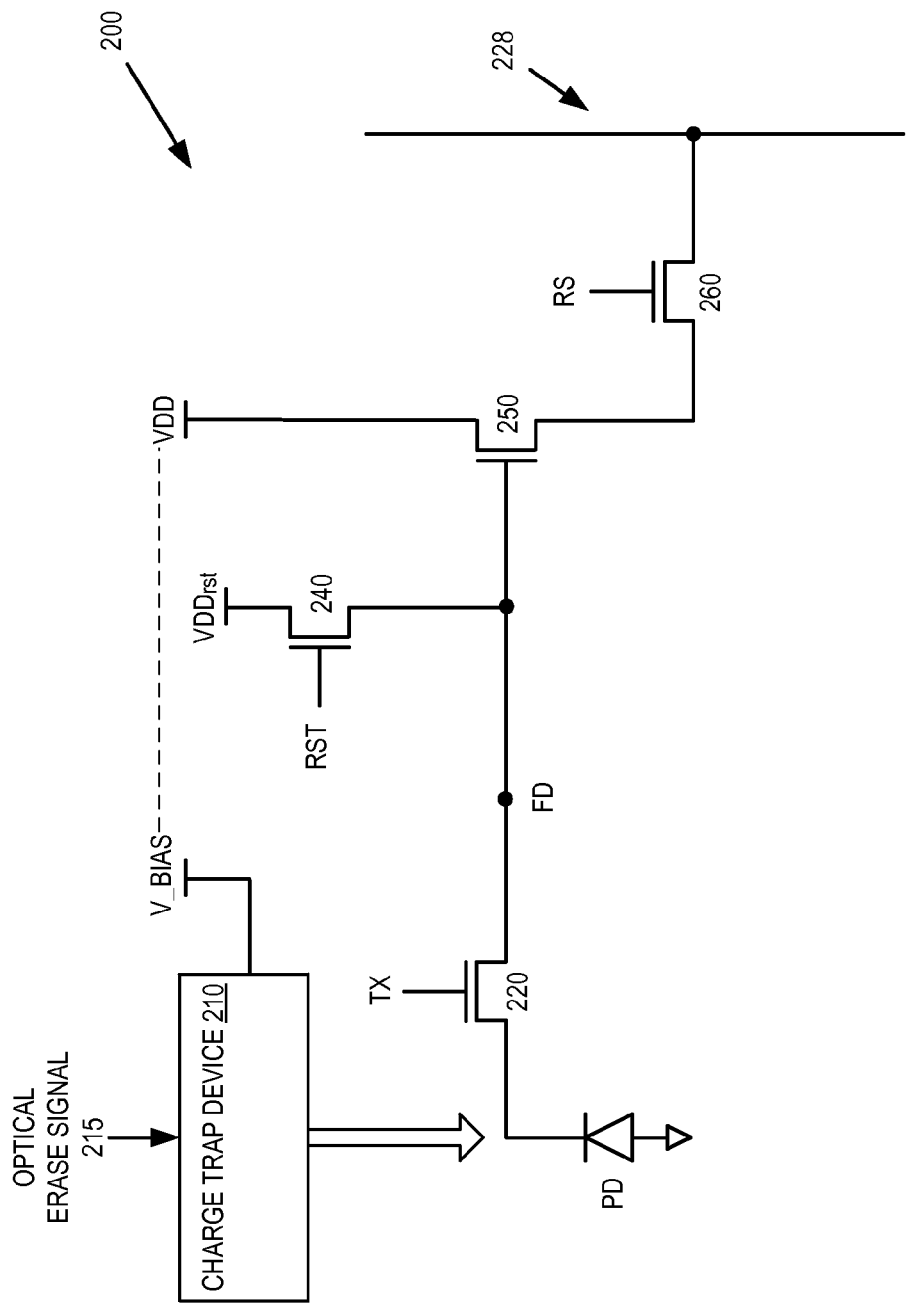
FIG. 2 is a schematic illustrating sample pixel circuitry of an image sensor pixel, in accordance with an embodiment of the present disclosure.

FIG. 2 is a schematic illustrating sample pixel circuitry 200 of a single image sensor pixel, in accordance with an embodiment of the present disclosure. Although FIG. 2 illustrates pixel circuitry 200 as a four-transistor ("4T") pixel architecture within a pixel array, pixel circuitry 200 is but one possible pixel circuitry architecture for implementing each pixel within pixel array 102 of FIG. 1. That is, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 2, pixel circuitry 200 includes a photosensitive element (e.g., photodiode PD), a transfer transistor 220, a reset transistor 240, a source-follower ("SF") transistor 250, and a select transistor 260. A charge trap device 210 is coupled electrostatically to the photodiode PD. In one embodiment, pixels P1-Pn, of FIG. 1, are implemented using pixel circuitry 200. During operation, transfer transistor 220 receives a transfer signal, which transfers the charge accumulated in photodiode PD while under the influence of charge trapped in charge trap device 210 to a floating diffusion node FD. In one embodiment, floating diffusion node FD may be coupled to a storage capacitor for temporarily storing image charges.

Charge trap device 210 is coupled to the cathode of photodiode PD and also coupled to receive a variable bias voltage V_BIAS. As will be discussed below, charge trap device 210 may receive a positive bias voltage V_BIAS, while charging and/or sensing the charge trapped in charge trap device 210. Subsequently, charge trap device 210 may receive a zero or negative bias voltage V_BIAS while the charge trap device 210 is illuminated with the optical erase signal 215 to erase the trapped charge.

Reset transistor 240 is coupled between a power rail VDDrst and the floating diffusion node FD to reset the pixel (e.g., discharge or charge the FD and the PD to a preset voltage) under control of a reset signal RST. The floating diffusion node FD is coupled to control the gate of SF transistor 250. SF transistor 250 is coupled between the power rail VDD and select transistor 260. In one embodiment, the drain region of the SF transistor 250 is coupled to the charge trap device 210 such that VDD is the same as the bias voltage V_BIAS, as shown by the line between V_BIAS and VDD, which is dashed to indicate that this coupling is optional. SF transistor 250 operates as a source-follower providing a high impedance connection to the floating diffusion FD. Select transistor 260 selectively couples the output of pixel circuitry 200 to the readout column line 228 under control of a select signal RS.

Figure 3:
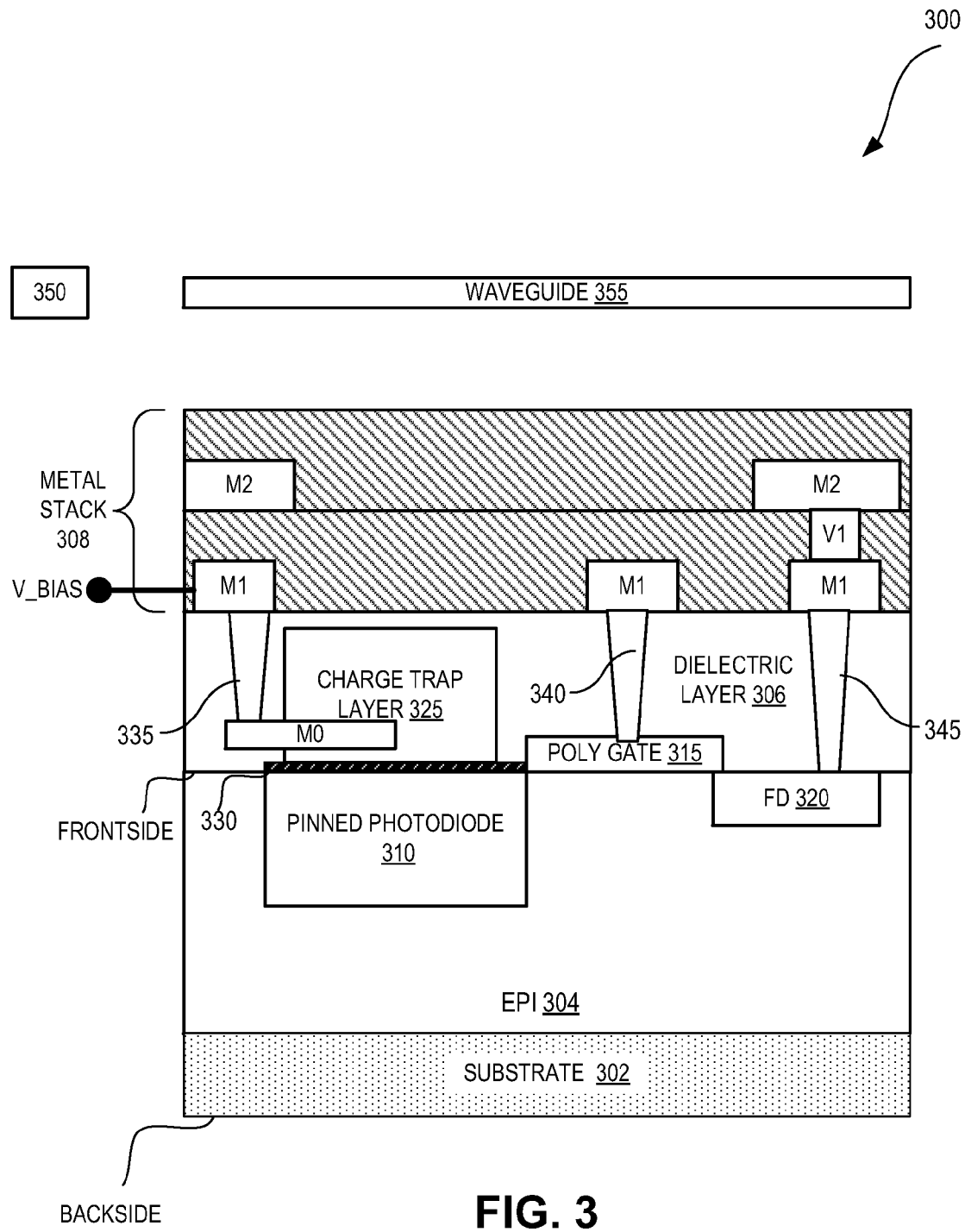
FIG. 3 is a cross-sectional view of an image sensor pixel including a charge trap layer, in accordance with an embodiment.

FIG. 3 is a cross-sectional view of an image sensor pixel 300 including a charge trap layer 325, in accordance with an embodiment. In the illustrated example, image sensor pixel 300 is an frontside illuminated (FSI) image sensor pixel configured for direct x-ray photon detection by way of charge trapping.

A metal stack 308 includes metal layers (e.g., metal layer M1 and M2), which are patterned in such a manner as to create an optical passage through which light incident on pixel 300 can reach photosensitive or photodiode ("PD") element 310. Generally, an image sensor includes several image sensor pixels 300 arranged in an array of two dimensional rows and columns in a larger substrate (i.e., extending beyond substrate 302 as shown). Pixel 300 further includes a floating diffusion (FD) region 320 disposed in a doped well (not shown) in epitaxial layer 304. As shown in FIG. 3, epitaxial layer 304 is disposed on substrate 302. Shallow trench isolations (not shown) may also be included in or on epitaxial layer 304 to separate pixel 300 from adjacent pixels. A transfer transistor having a transfer poly gate 315 is disposed between photosensitive element 310 and FD region 320, and is used to transfer the signal output from photosensitive element 310 under the influence of charge trap layer 325 to floating diffusion region 320.

Further shown in FIG. 3 is a oxide layer 330 disposed on the frontside surface of epitaxial layer 304. In one example, oxide layer 330 and charge trap layer 325 have a thickness of about 100 micrometers to about 1 millimeter for x-ray photon detection of 10 keV to about 50 keV. Charge trap layer 325 is then disposed on oxide 330. In one embodiment, charge trap layer 325 includes a dielectric, such as Silicon Nitride (SiN), Hafnium Oxide (HfO), Tantalum Oxide (TaO), Silicon Oxide (SiO), or Silicon Oxy-Nitride (SiON). Also shown are metal contacts 335, 340, and 345. One or more of metal contacts 335, 340, and 345 may include titanium (Ti), tungsten (W), and aluminum (Al). Metal contact 335 is electrically coupled to metal layer M1 and to metal layer M0 to provide a bias voltage V_BIAS to the charge trap layer 325. In one embodiment, metal contact 335 is further coupled to a drain region of a source follower transistor (e.g., drain of SF transistor 250 of FIG. 2).

Metal contact 340 is electrically coupled to metal layer M1 and to poly gate 315 to provide a control signal, such as the transfer signal TX, to gate 315. Metal contact 345 is electrically coupled to metal layer M2 by way of via V1 and metal layer M1. Metal contact 345 is also electrically coupled to the floating diffusion region 320.

As shown in FIG. 3, pixel 300 may also include a light source coupled to emit an optical erase signal to erase charge trapped in charge trap layer 325. The light source of pixel 300 includes a light emitting diode 350 and a planar waveguide 355. In one embodiment, the optical erase signal emitted by diode 350 and/or waveguide 355 is a blue light having a wavelength of about 405 nanometers.

Figure 4A:
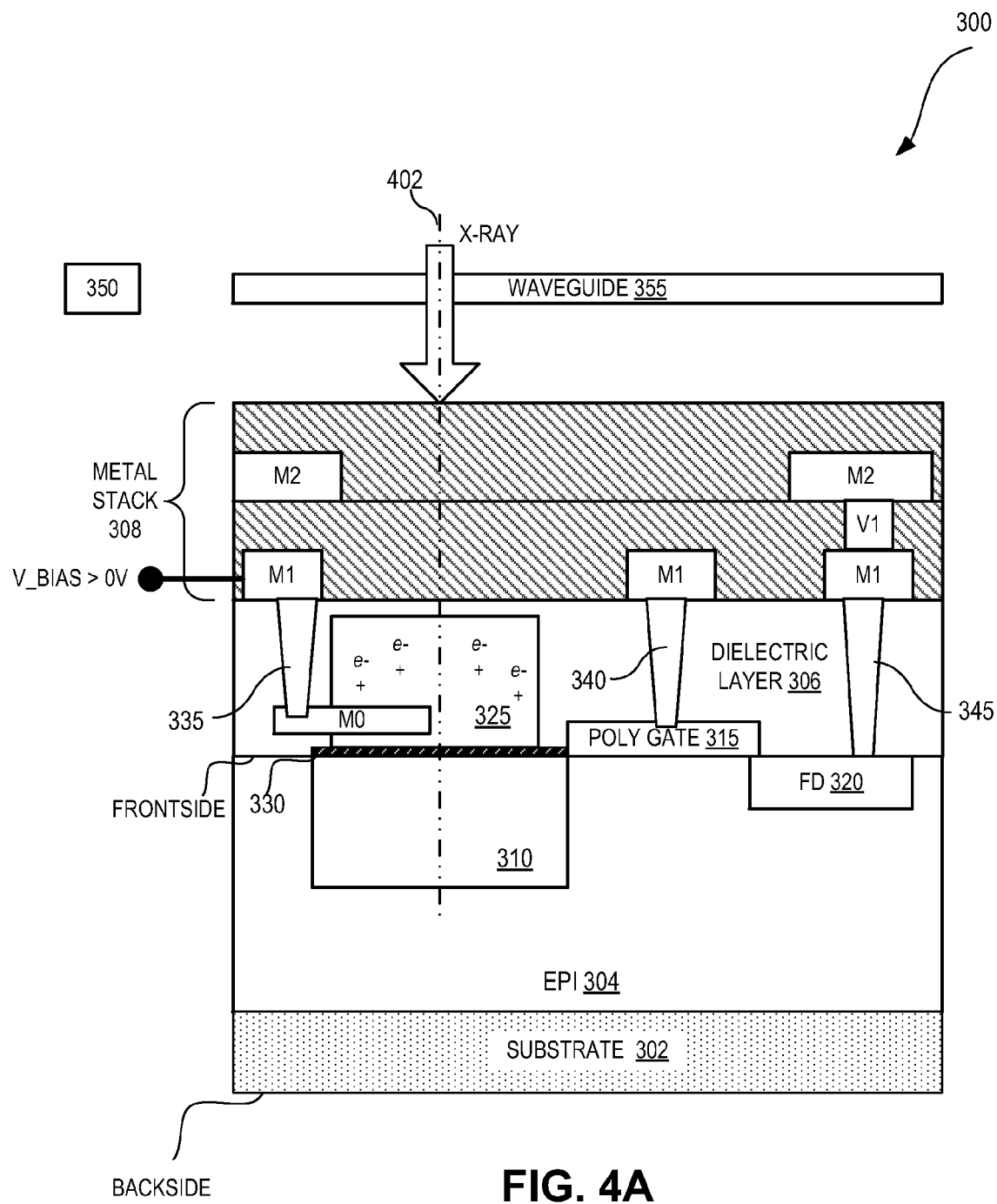
FIGS. 4A-4C are cross sectional views of a process for operating an image sensor pixel having a charge trap layer, in accordance with an embodiment of the present disclosure.
Figure 4B:
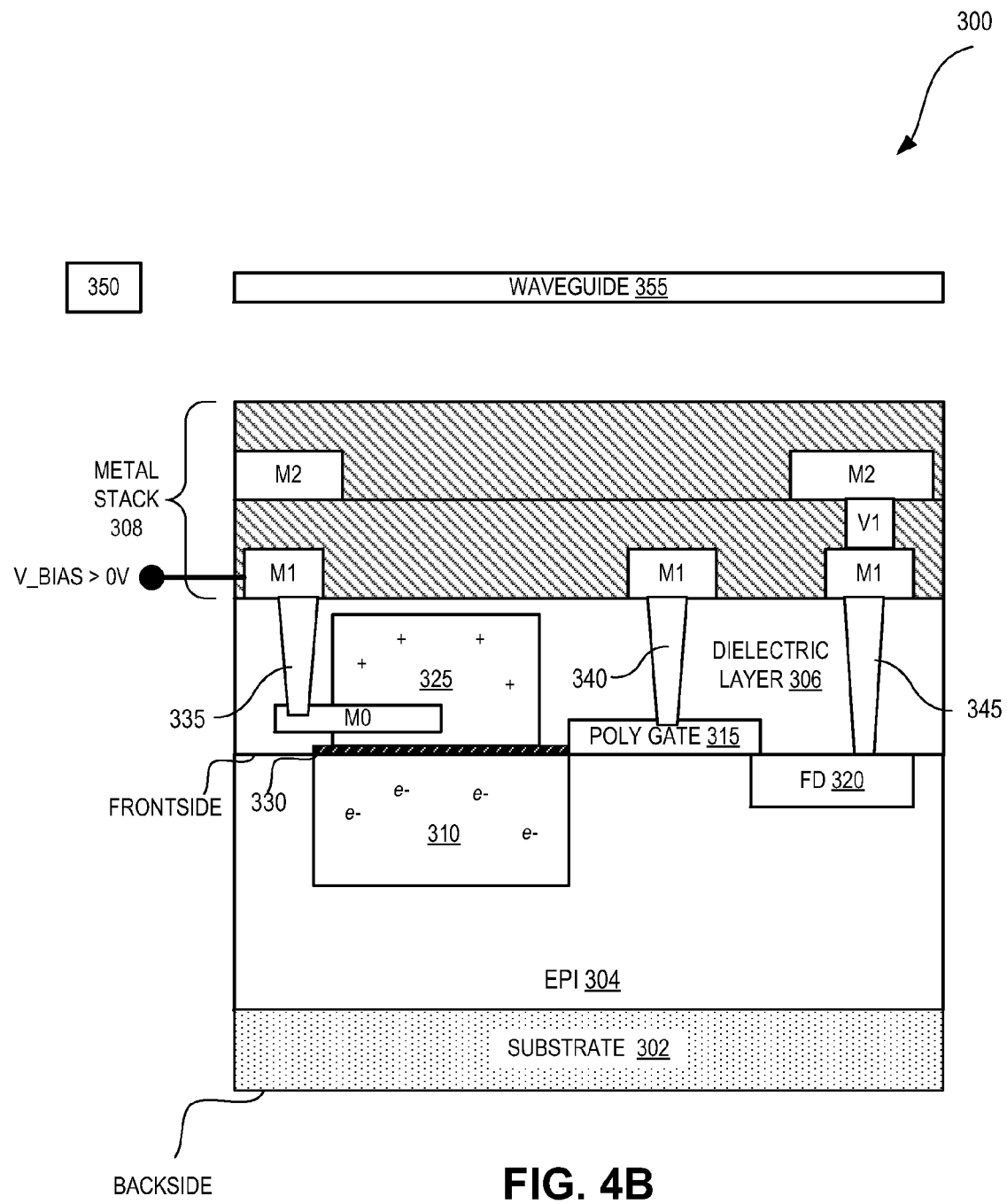
Figure 4C:
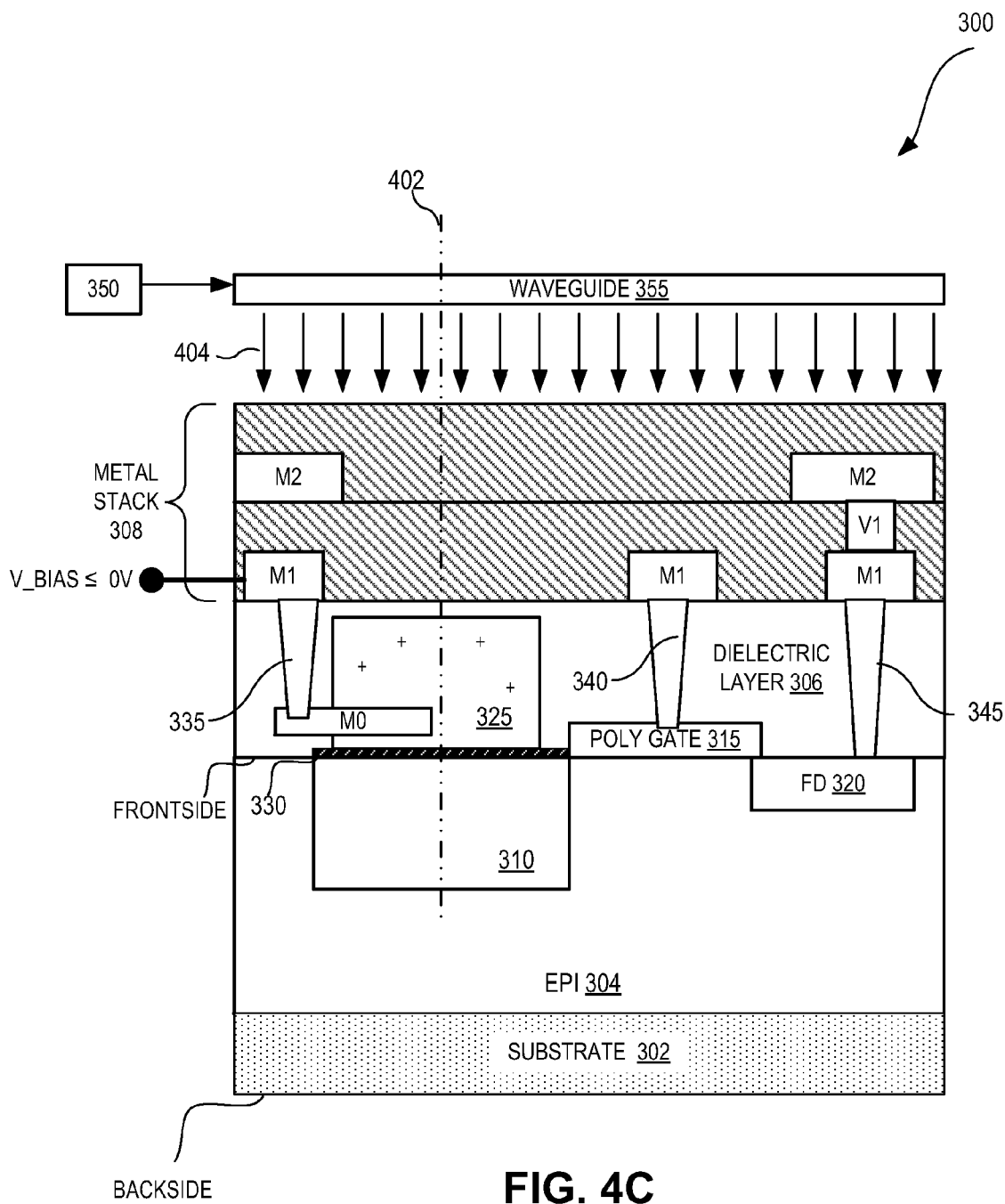

The operation of pixel 300 will now be described with reference to FIGS. 4A-4C. FIG. 4A illustrates an exposure period where x-ray radiation charges dielectric trap layer 325. As shown, charge trap layer 325 is disposed to receive the x-ray radiation along vertical axis 402. Also shown is that dielectric trap layer 325 is biased with a positive bias voltage V_BIAS during this period. FIG. 4B illustrates the sensing and readout of excess or reduced dark current collected in photosensitive element 310 induced by the trapped charges. In one embodiment, the induced dark current is read out multiple times and averaged over multiple frames so as to increase the signal to noise ratio of the pixel. FIG. 4C illustrates erasing the positive charge trapped in charge trap device 325 by applying a zero or negative bias voltage V_BIAS and by exposing the charge trap layer 325 to optical erase signal 404. As mentioned above, laser 350 may be a blue laser emitting blue light having a wavelength of approximately 405 nm.

Figure 5:
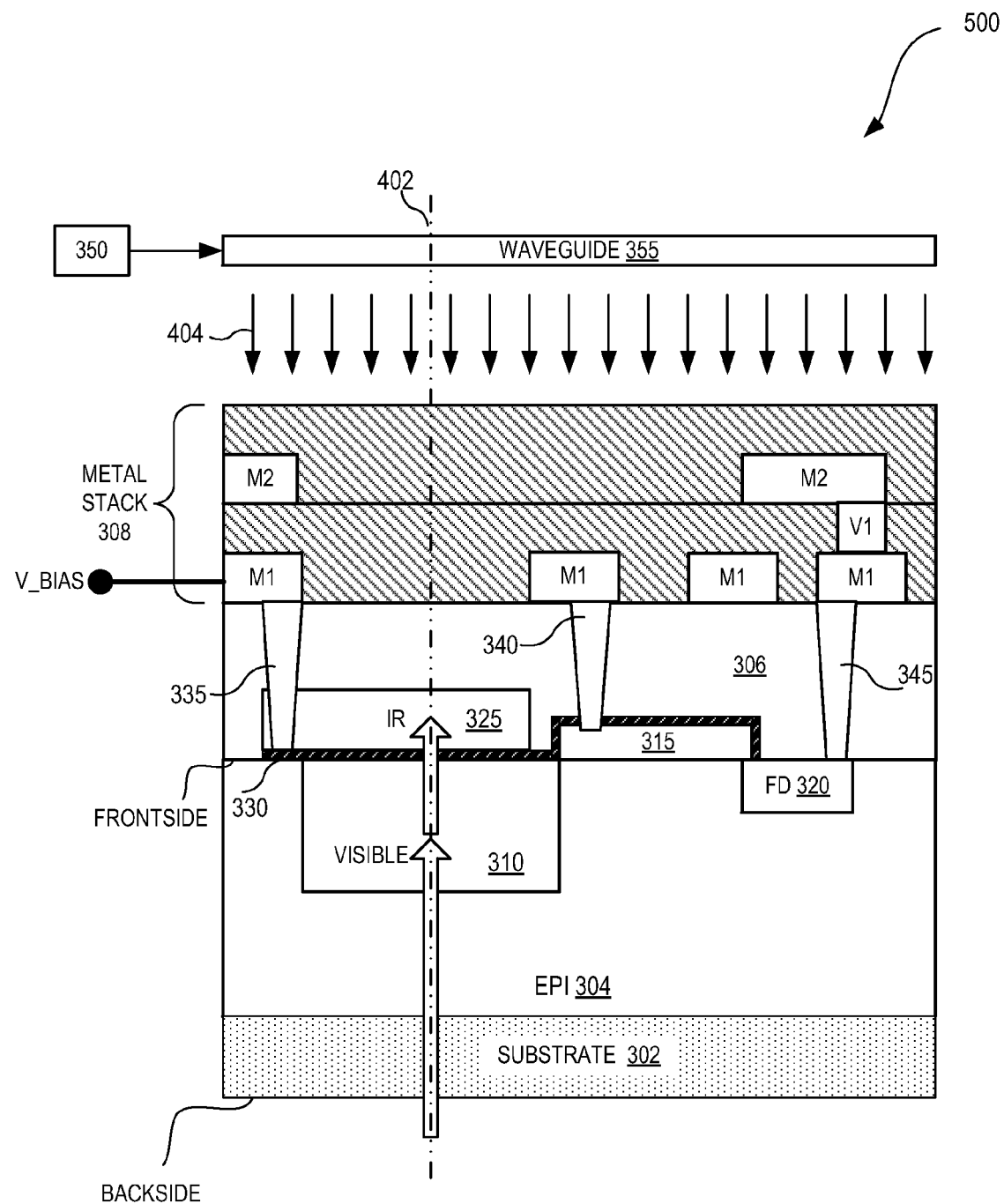
FIG. 5 is a cross-sectional view of a backside illuminated (BSI) image sensor pixel including a charge trap layer disposed on a frontside of the image sensor, where the charge trap layer is erased from the frontside, in accordance with an embodiment of the present disclosure.

FIG. 5 is a cross-sectional view of a backside illuminated (BSI) image sensor pixel 500 including charge trap layer 325 disposed on a frontside of the image sensor, where the charge trap layer is erased from the frontside, in accordance with an embodiment of the present disclosure. In one embodiment image sensor pixel 500 is a pixel configured for imaging infrared/thermal wavelength energy that is smaller than the silicon bandgap. This is because the shallow trap levels of dielectric charge trap layer 325 may be utilized for IR detection.

As shown in FIG. 5, IR light and visible light are incident on the backside of pixel 500. Both the IR light and visible light propagate along the vertical axis 402 through more than approximately 50 micrometers of silicon. The visible light generates charge in photodiode region 310, while the IR light continues to propagate through the frontside of epitaxial layer 304 to create charging at the charge trap device 325. During a readout phase, pixel 500 may be read out twice, once to read out the charge accumulated in photodiode region 310 due to visible light and then a second time to readout the dark signal representative of the infrared image trapped in the dielectric charge trap device 325. As with the previous embodiment, image sensor pixel 500 includes a light source disposed on the front side of the pixel such that optical erase signal 404 is dispersed onto charge trap layer 325 along vertical axis 402.

Figure 6:
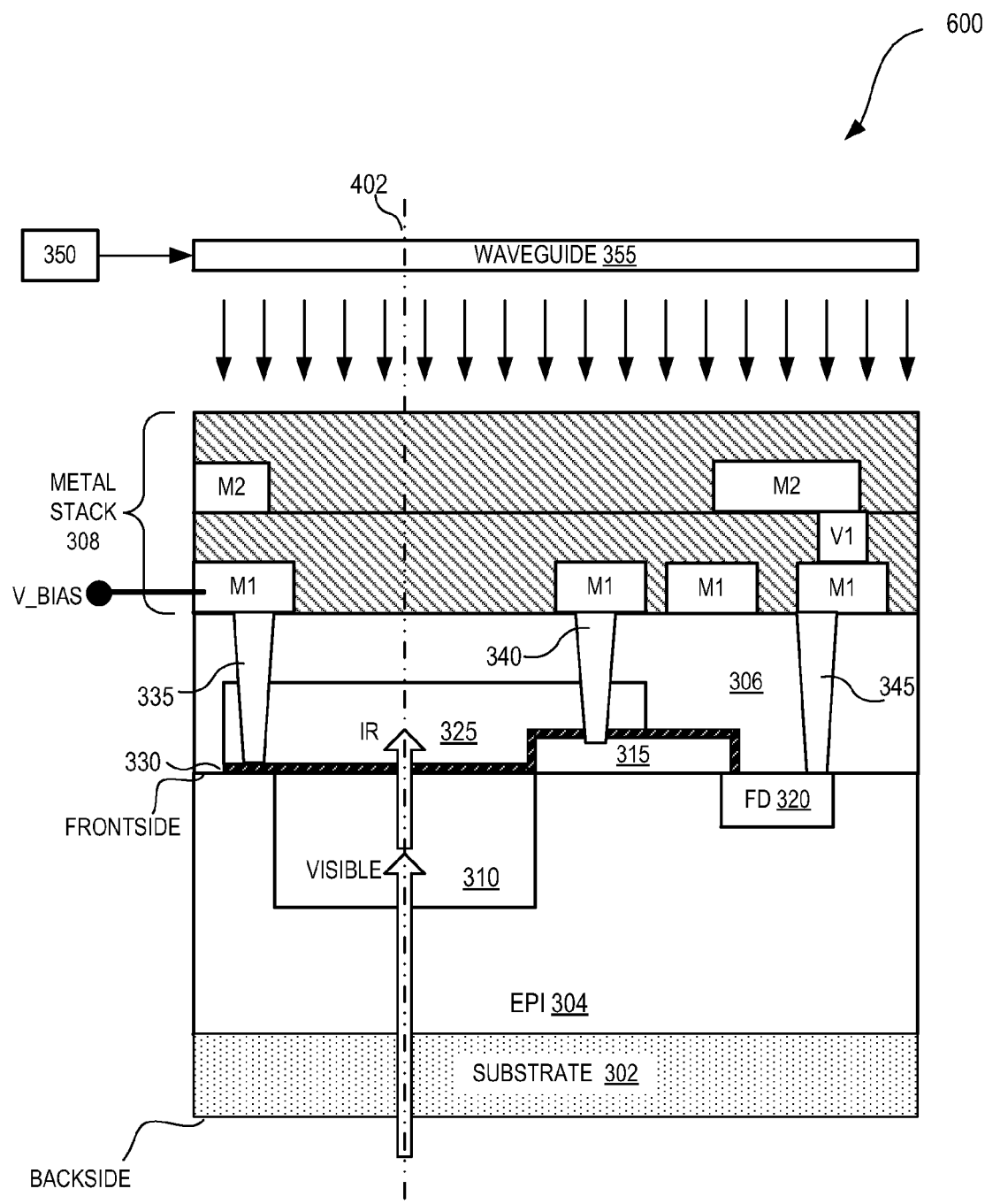
FIG. 6 is a cross-sectional view of a BSI image sensor pixel including a charge trap layer that is disposed over a portion of the transfer gate, in accordance with an embodiment of the present disclosure.

FIG. 6 is a cross-sectional view of a BSI image sensor pixel 600 including a charge trap layer 325 that is disposed over a portion of the transfer gate 315, in accordance with an embodiment of the present disclosure. As shown, charge trap layer 325 is in electrical contact with both metal contact 335 and with metal contact 340. In operation the biasing of the charge trap layer 325 may be controlled by both the bias voltage V_BIAS and by a voltage provided by metal contact 340. For example, during an exposure period, the bias voltage V_BIAS may be at a positive 3 volts, while metal contact 340 provides a negative one (1) volt.

Figure 7:
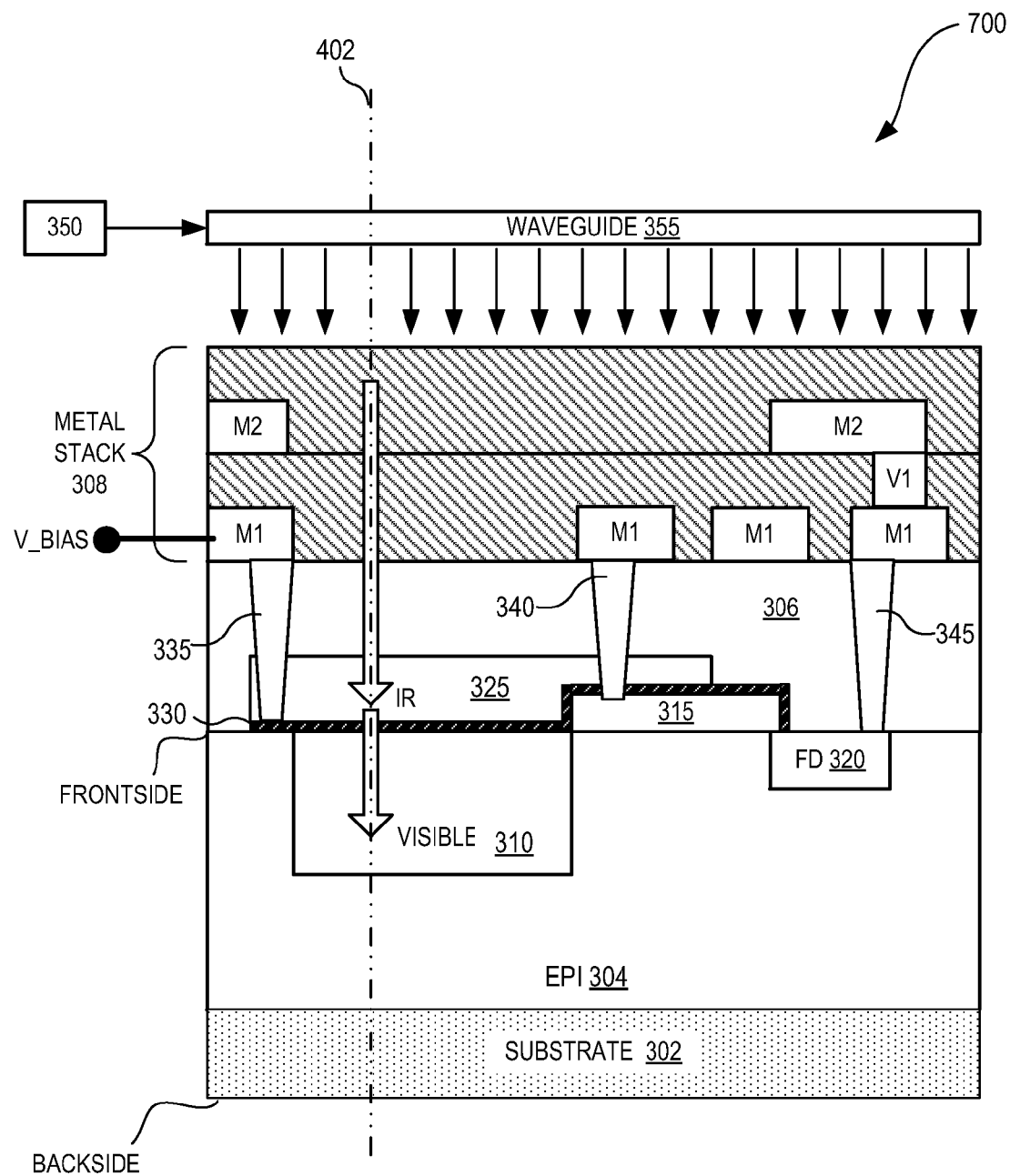
FIG. 7 is a cross-sectional view of a frontside illuminated (FSI) image sensor pixel including a charge trap layer disposed on a frontside of the image sensor, where the charge trap layer is erased from the frontside, in accordance with an embodiment of the present disclosure.

FIG. 7 is a cross-sectional view of a frontside illuminated (FSI) image sensor pixel 700 including charge trap layer 325 disposed on a frontside of the image sensor, where the charge trap layer 325 is erased from the frontside, in accordance with an embodiment of the present disclosure.

Figure 8:
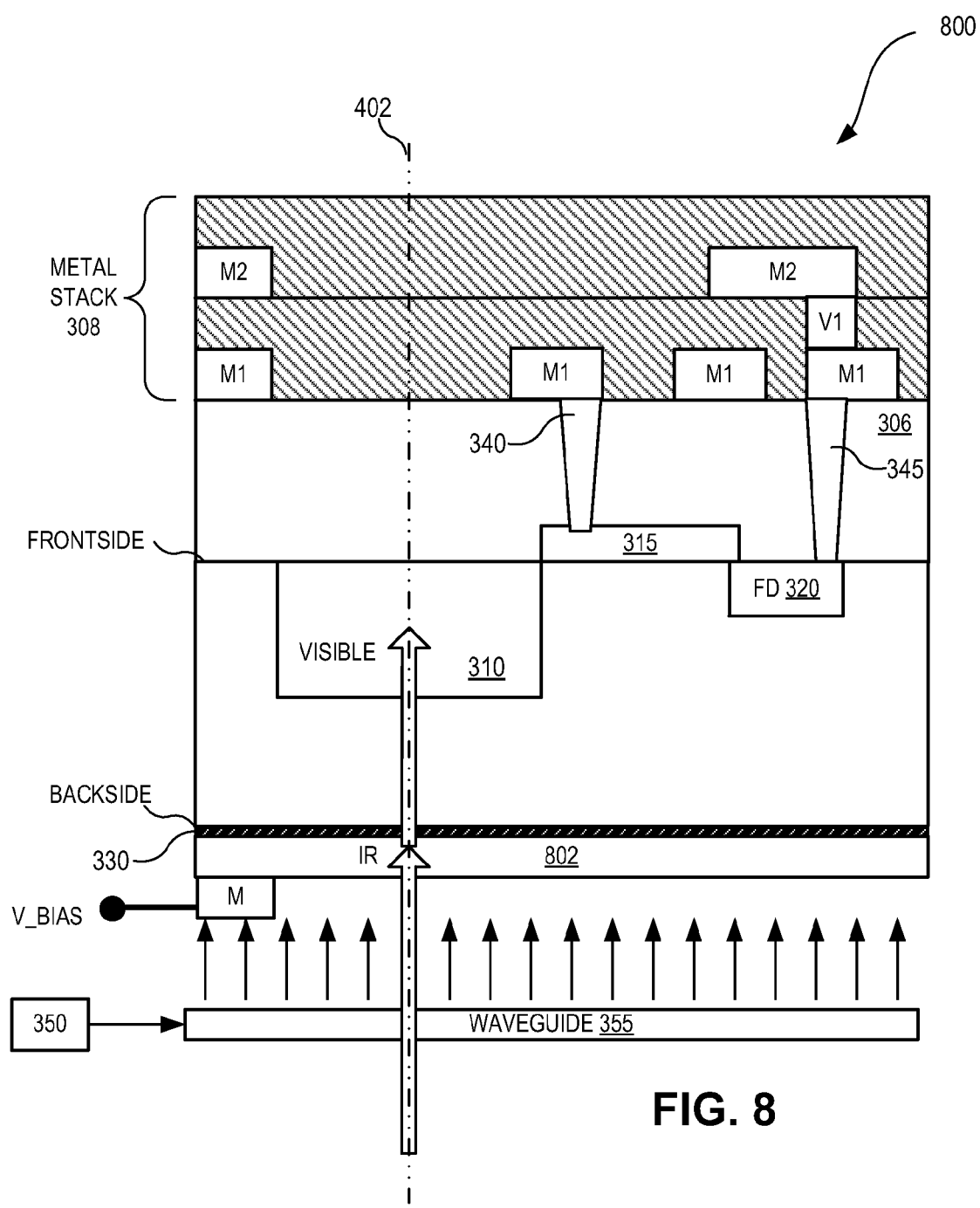
FIG. 8 is a cross-sectional view of a BSI image sensor pixel including a charge trap layer disposed on a backside of the image sensor, where the charge trap layer is erased from the backside, in accordance with an embodiment of the present disclosure.

FIG. 8 is a cross-sectional view of a BSI image sensor pixel 800 including a charge trap layer 802 disposed on a backside of the image sensor, where the charge trap layer 802 is erased from the backside, in accordance with an embodiment of the present disclosure. As shown in FIG. 8, oxide layer 330 is disposed on the backside of the image sensor pixel 800 and dielectric charge trap layer 802 is disposed on the oxide layer 330. Also shown is a metal contact M disposed on the backside of the device to provide the bias voltage V_BIAS. In one embodiment, metal contact M is coupled to metal layer M1 by a via (not shown) or other wiring (not shown). In operation, image sensor pixel 800 receives both IR and Visible light incident on the backside of pixel 800. The IR light generates charge in the charge trap layer 802, while the visible light generates charge in pinned photodiode region 310. Planar waveguide 355 is further disposed on the backside of the pixel 800. As shown, waveguide 355 is transmissive to both the visible and IR light.

In the disclosed embodiments, substrate 302 may be P type doped, epi layer 304 may be P type doped, floating diffusion 320 may be N type doped, photosensitive element 310 may be N type doped, pinning layer (not shown) may be P type doped, and transfer gate 315 may be N type doped. It should be appreciated that the conductivity types of all the elements can be swapped such that, for example, substrate 302 may be N+ doped, epi layer 304 may be N− doped, and photosensitive element 310 may be P doped.

The above description of illustrated embodiments of the invention, including what is described in the Abstract, is not intended to be exhaustive or to limit the embodiments to the precise forms disclosed. While specific embodiments are described herein for illustrative purposes, various modifications are possible within the scope, as those skilled in the relevant art will recognize. These modifications can be made in light of the above detailed description. Examples of some such modifications include dopant concentration, layer thicknesses, and the like. Further, although the embodiments illustrated herein refer to CMOS sensors using frontside illumination, it will be appreciated that they may also be applicable to CMOS sensors using backside illumination.

The terms used in the following claims should not be construed to limit the invention to the specific embodiments disclosed in the specification. Rather, the scope is to be determined entirely by the following claims, which are to be construed in accordance with established doctrines of claim interpretation.

What is claimed is:

1. An image sensor pixel, comprising:
   a photosensitive element disposed in a semiconductor layer to receive electromagnetic radiation of a first type along a vertical axis;
   a floating diffusion region disposed in the semiconductor layer;
   a transfer gate disposed on the semiconductor layer between the photosensitive element and the floating diffusion region to control a flow of charge produced in the photosensitive element to the floating diffusion region;
   a dielectric charge trapping device disposed on the semiconductor layer to receive electromagnetic radiation of a second type along the vertical axis and to trap charges in response to the electromagnetic radiation of the second type, wherein the dielectric charge trapping device is further configured to induce charge in the photosensitive element in response to the trapped charges;
   a first metal contact coupled to the dielectric charge trapping device to provide a first bias voltage to the dielectric charge trapping device; and
   a light source coupled to emit an optical erase signal along the vertical axis to erase charge trapped in the dielectric charge trapping device, wherein the light source comprises:
   a light emitting diode; and a waveguide optically coupled to the light emitting diode and configured to emit the optical erase signal along the vertical axis.

2. The image sensor pixel of claim 1, further comprising a source follower transistor having a drain region, wherein the first metal contact is coupled to the drain region to provide the first bias voltage to the drain region.

3. The image sensor pixel of claim 1, further comprising an oxide layer disposed on a surface of the semiconductor layer, wherein the dielectric charge trapping device is disposed on the oxide layer.

4. The image sensor pixel of claim 1, further comprising a second metal contact coupled to the transfer gate to control a transfer of charge from the photosensitive region to the floating diffusion region, wherein the dielectric charge trapping device overlaps at least a portion of the transfer gate and is coupled to the second metal contact to receive a second bias voltage.

5. The image sensor pixel of claim 1, wherein the optical erase signal is blue light having a wavelength of about 405 nanometers.

6. The image sensor pixel of claim 1, wherein the electromagnetic radiation of the first type includes visible light and the electromagnetic radiation of the second type includes infrared light.

7. The image sensor pixel of claim 1, wherein the electromagnetic radiation of the second type includes x-rays.

8. The image sensor pixel of claim 1, wherein the dielectric charge trapping device includes at least one dielectric selected from the group consisting of Silicon Nitride (SiN), Hafnium Oxide (HfO), Tantalum Oxide (TaO), Silicon Oxide (SiO), and Silicon Oxy-Nitride (SiON).

9. The image sensor pixel of claim 1, wherein the first metal contact includes at least one metal selected from the group consisting of titanium (Ti), tungsten (W), and aluminum (Al).

10. The image sensor pixel of claim 1, wherein the image sensor pixel is a backside illuminated image sensor pixel wherein the electromagnetic radiation of the first and second types are incident on a backside of the semiconductor layer and wherein a first side of the dielectric charge trapping device is disposed on the backside of the semiconductor layer, wherein the light source coupled to emit an optical erase signal along the vertical axis is configured such that the optical erase signal is incident on a second side of the dielectric charge trapping device.

11. The image sensor pixel of claim 1, wherein the image sensor pixel is a backside illuminated image sensor pixel wherein the electromagnetic radiation of the first and second types are incident on a backside of the semiconductor layer and wherein a first side of the dielectric charge trapping device is disposed on a frontside of the semiconductor layer, wherein the light source coupled to emit an optical erase signal along the vertical axis is configured such that the optical erase signal is incident on a second side of the dielectric charge trapping device.

12. The image sensor pixel of claim 1, wherein the photosensitive element includes a pinned photodiode.

13. An image sensor comprising:
a complementary metal-oxide-semiconductor ("CMOS") array of image sensor pixels, wherein each of the image sensor pixels includes:
a photosensitive element disposed in a semiconductor layer of the image sensor to receive electromagnetic radiation of a first type along a vertical axis;
a floating diffusion region disposed in the semiconductor layer;
a transfer gate disposed on the semiconductor layer between the photosensitive element and the floating diffusion region to control a flow of charge produced in the photosensitive element to the floating diffusion region;
a dielectric charge trapping device disposed on the semiconductor layer to receive electromagnetic radiation of a second type along the vertical axis and to trap charges in response to the electromagnetic radiation of the second type, wherein the dielectric charge trapping device is further configured to induce charge in the photosensitive element in response to the trapped charges;
a first metal contact coupled to the dielectric charge trapping device to provide a first bias voltage to the dielectric charge trapping device; and
a light source coupled to emit an optical erase signal along the vertical axis to erase charge trapped in each dielectric charge trapping device, wherein the light source comprises:
a light emitting diode; and
a waveguide optically coupled to the light emitting diode and configured to emit the optical erase signal along the vertical axis.

14. The image sensor of claim 13, wherein each image sensor pixel further comprises a source follower transistor having a drain region, wherein each first metal contact is further coupled to the drain region of a respective source follower transistor to provide the first bias voltage to the drain region.

15. The image sensor of claim 13, further comprising an oxide layer disposed on a surface of the semiconductor layer, wherein the dielectric charge trapping device is disposed on the oxide layer.

16. The image sensor of claim 13, wherein each image sensor pixel further comprises a second metal contact coupled to the transfer gate to control a transfer of charge from the photosensitive region to the floating diffusion region, wherein the dielectric charge trapping device overlaps at least a portion of the transfer gate and is coupled to the second metal contact to receive a second bias voltage.

17. The image sensor of claim 13, wherein the electromagnetic radiation of the first type includes visible light and the electromagnetic radiation of the second type includes infrared light.

18. The image sensor of claim 13, wherein the electromagnetic radiation of the second type includes x-rays.

19. The image sensor of claim 13, wherein each dielectric charge trapping device includes at least one dielectric selected from the group consisting of Silicon Nitride (SiN), Hafnium Oxide (HfO), Tantalum Oxide (TaO), Silicon Oxide (SiO), and Silicon Oxy-Nitride (SiON).

20. The image sensor of claim 13, wherein the image sensor is a backside illuminated image sensor wherein the electromagnetic radiation of the first and second types are incident on a backside of the semiconductor layer and wherein a first side of the dielectric charge trapping device is disposed on the backside of the semiconductor layer, wherein the light source coupled to emit an optical erase signal along the vertical axis is configured such that the optical erase signal is incident on a second side of the dielectric charge trapping devices.

21. The image sensor of claim 13, wherein the image sensor is a backside illuminated image sensor wherein the electromagnetic radiation of the first and second types are incident on a backside of the semiconductor layer and wherein a first side of the dielectric charge trapping device is disposed on a frontside of the semiconductor layer, wherein the light source coupled to emit an optical erase signal along the vertical axis is configured such that the optical erase signal is incident on a second side of each dielectric charge trapping device.

\* \* \* \* \*